(12) United States Patent
Spory

(10) Patent No.: US 10,431,510 B2
(45) Date of Patent: Oct. 1, 2019

(54) HERMETIC LID SEAL PRINTING METHOD

(71) Applicant: Erick Merle Spory, Colorado Springs, CO (US)

(72) Inventor: Erick Merle Spory, Colorado Springs, CO (US)

(73) Assignee: Global Circuit Innovations, Inc., Colorado Springs, CO (US)

( * ) Notice: Subject to any disclaimer, the term of this patent is extended or adjusted under 35 U.S.C. 154(b) by 0 days.

(21) Appl. No.: 15/954,256

(22) Filed: Apr. 16, 2018

(65) Prior Publication Data

US 2018/0240722 A1 Aug. 23, 2018

Related U.S. Application Data

(60) Provisional application No. 62/632,249, filed on Feb. 19, 2018, provisional application No. 62/569,717, filed on Oct. 9, 2017.

(51) Int. Cl.
| | | |
|---|---|---|
| *H01L 23/10* | (2006.01) | |
| *H01L 21/48* | (2006.01) | |
| *H01L 21/50* | (2006.01) | |

(52) U.S. Cl.
CPC .......... *H01L 23/10* (2013.01); *H01L 21/4803* (2013.01); *H01L 21/50* (2013.01)

(58) Field of Classification Search
CPC ...... H01L 23/10; H01L 21/50; H01L 21/4803
See application file for complete search history.

(56) References Cited

U.S. PATENT DOCUMENTS

| | | | |
|---|---|---|---|
| 5,315,486 A * | 5/1994 | Fillion | H01L 23/057 361/795 |
| 5,372,296 A | 12/1994 | Konecke et al. | |
| 5,771,562 A * | 6/1998 | Harvey, III | H01L 51/5243 29/592.1 |
| 6,037,193 A | 3/2000 | Interrante et al. | |
| 6,216,939 B1 | 4/2001 | Thackara | |
| 6,222,737 B1 | 4/2001 | Ross | |
| 6,360,433 B1 | 3/2002 | Ross | |
| 8,129,032 B2 | 3/2012 | Dabadie et al. | |
| 9,165,961 B2 | 10/2015 | Iwama et al. | |
| 9,196,555 B1 * | 11/2015 | Lower | H01L 23/24 |
| 2003/0183920 A1 | 10/2003 | Goodrich et al. | |
| 2006/0067641 A1 * | 3/2006 | Palmateer | B81C 1/00285 385/147 |
| 2008/0217752 A1 * | 9/2008 | Hata | B81C 1/00269 257/686 |
| 2009/0309459 A1 * | 12/2009 | Ogashiwa | B22F 1/0074 310/348 |
| 2014/0252584 A1 * | 9/2014 | Spory | H01L 24/83 257/690 |

* cited by examiner

*Primary Examiner* — Yasser A Abdelaziez
(74) *Attorney, Agent, or Firm* — Thomas J. Lavan

(57) ABSTRACT

A method is provided. The method includes one or more of securing a die into a cavity of a hermetic package base, providing one or more bond connections to the die, placing a hermetic package lid on the package base, and 3D printing, by a 3D printer, hermetic lid seal material to a joint between the hermetic package base and the hermetic package lid, at a temperature at or below 100 degrees Celsius.

20 Claims, 11 Drawing Sheets

Applying Hermetic Overspray with 3D Printer

*Fig. 1A  Hermetic Seal Configuration*
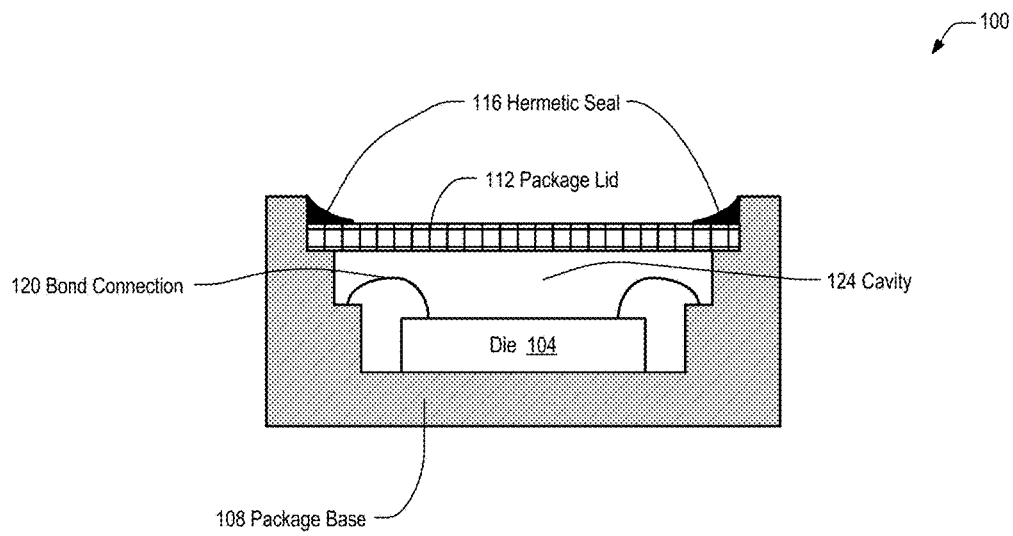
*Fig. 1B  Hermetic Seal Configuration*
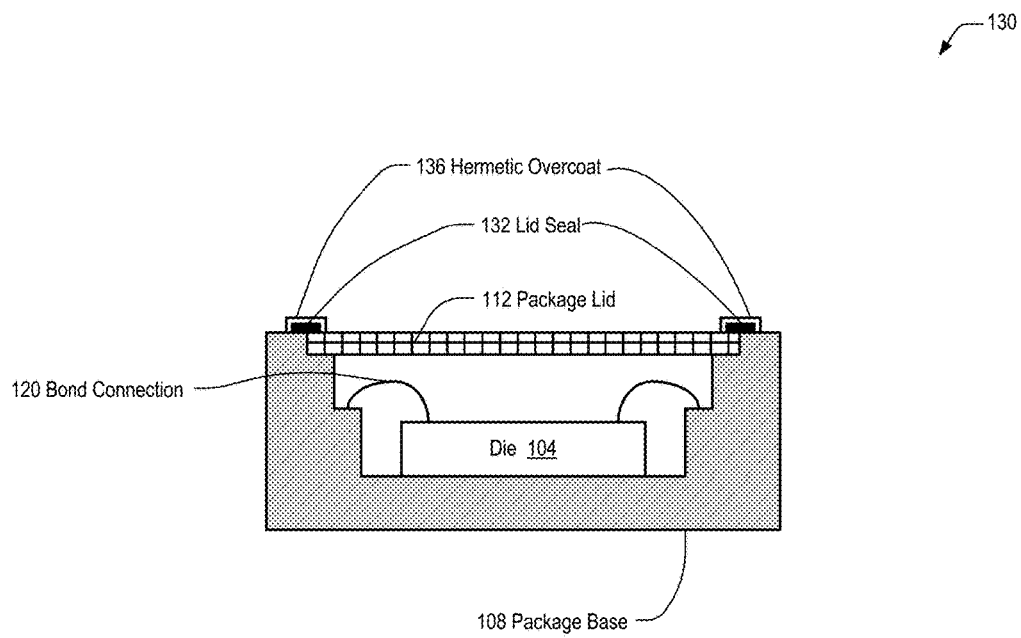

*Fig. 1C  Hermetic Seal Configuration*
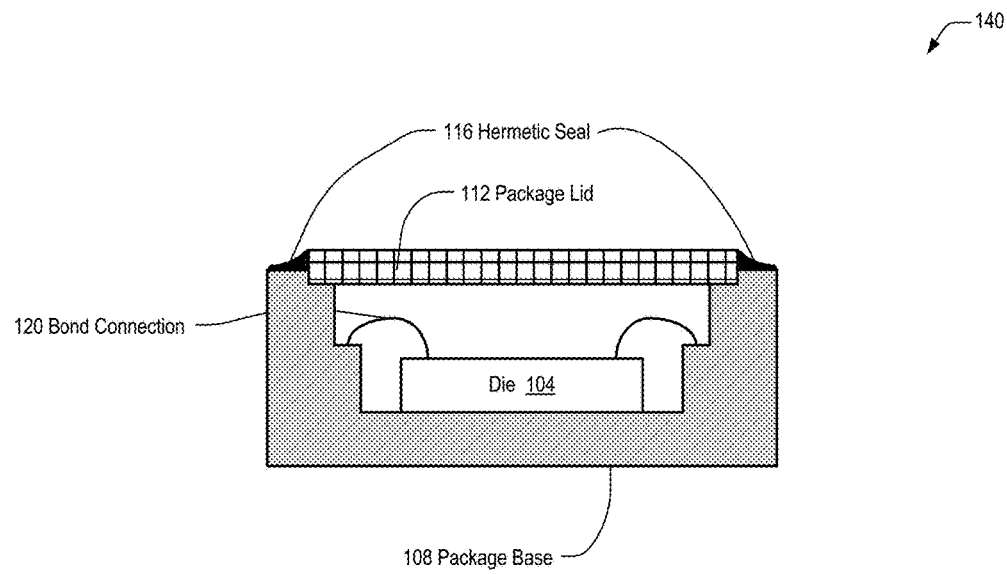
*Fig. 1D  Hermetic Seal Configuration*
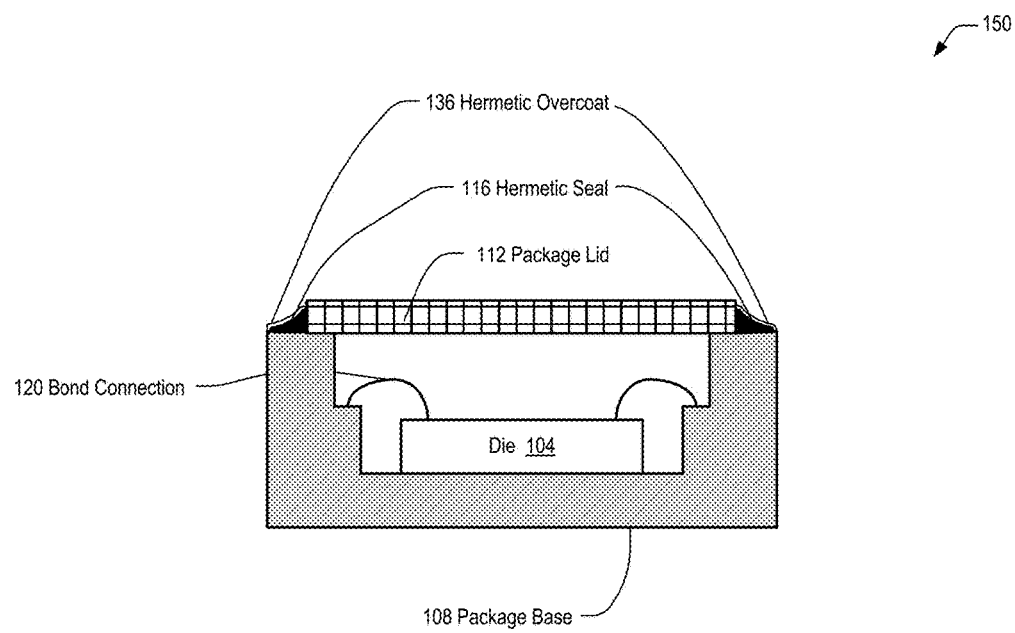

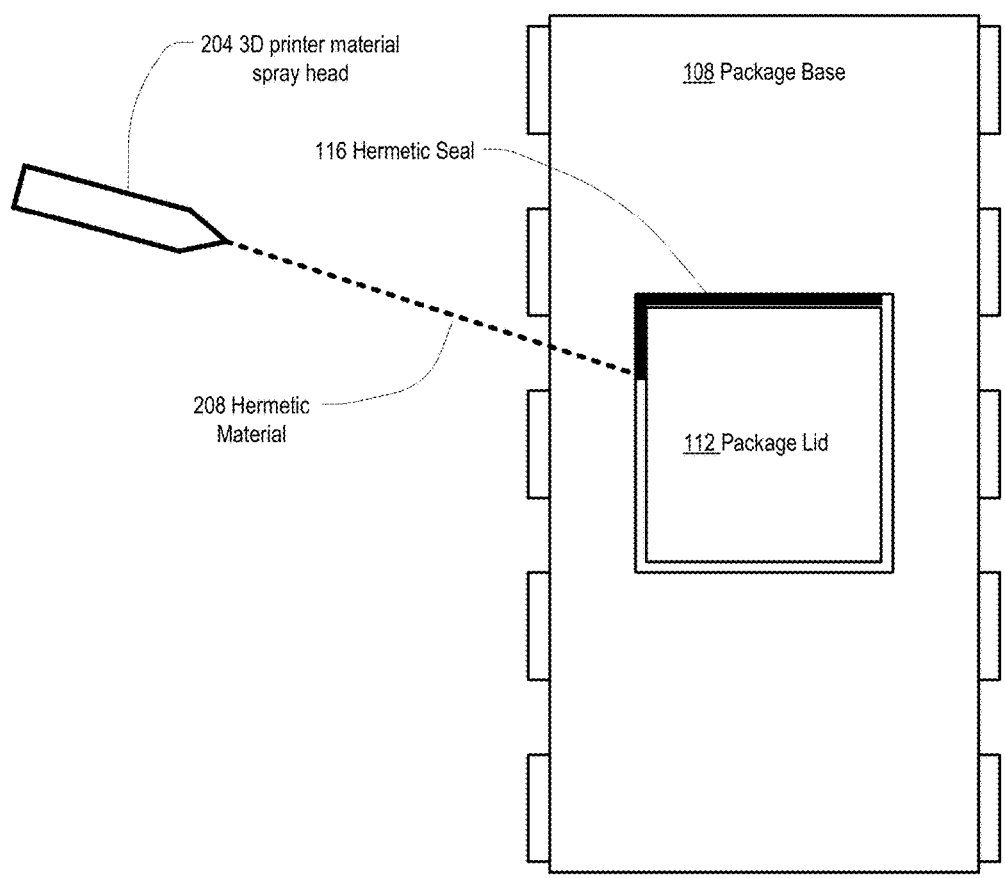
Fig. 2A  Applying Hermetic Lid Seal Material with 3D Printer

Fig. 2B  Laser Sintering Hermetic Lid Seal Material
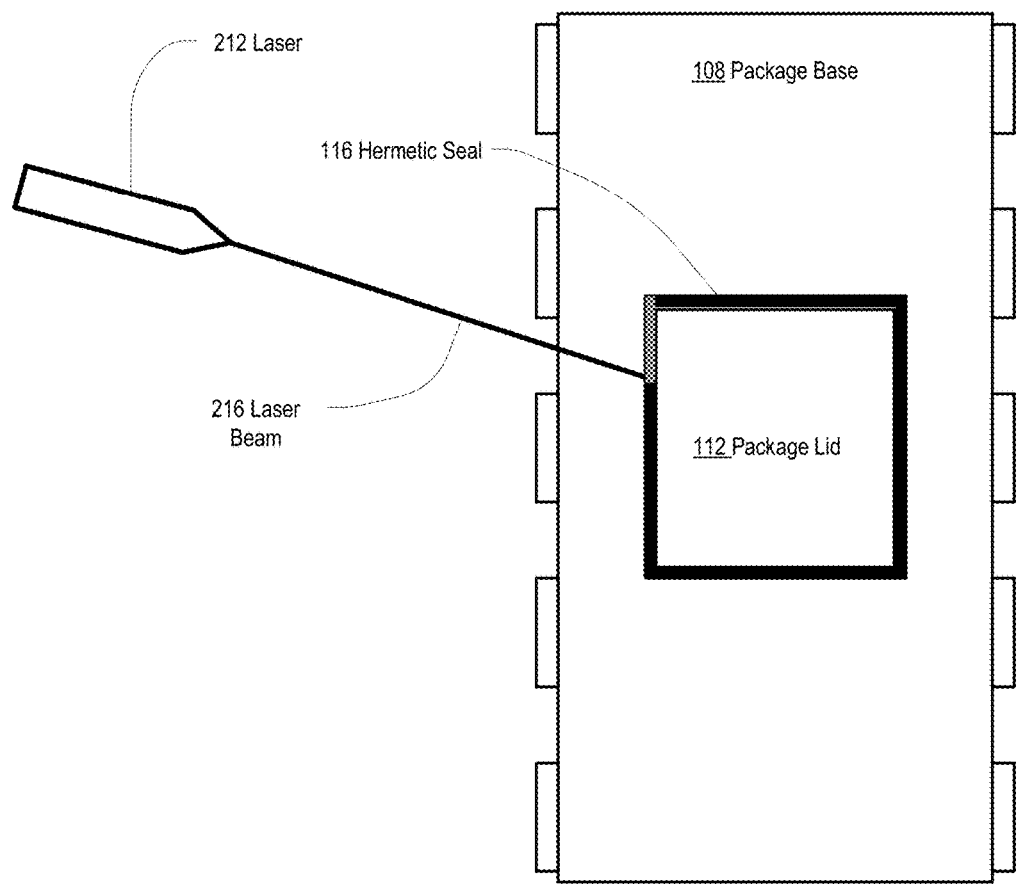

Fig. 2C  Packaged Integrated Circuit with Hermetic Lid Seal
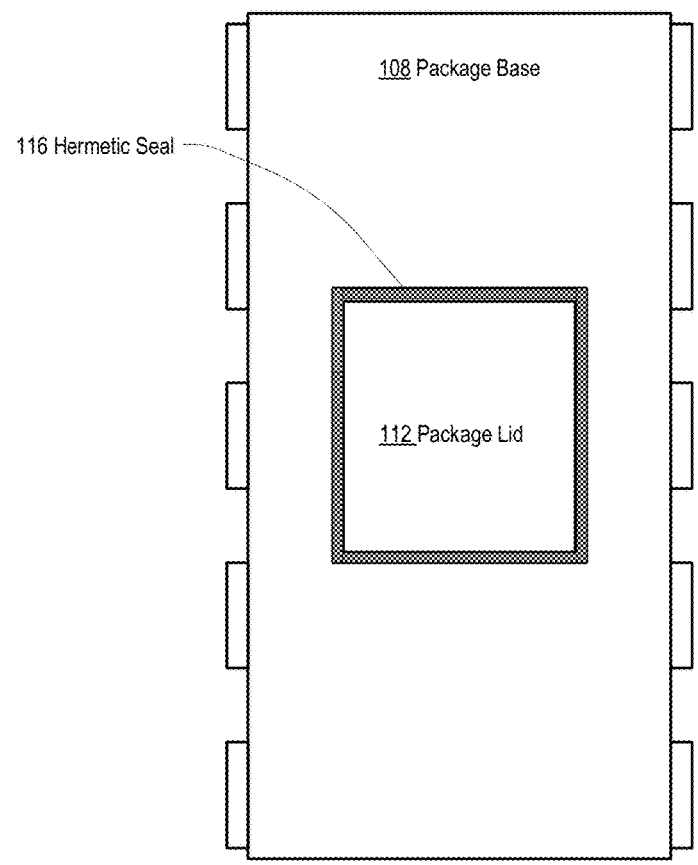

Fig. 3A  Applying Lid Seal Material with 3D Printer
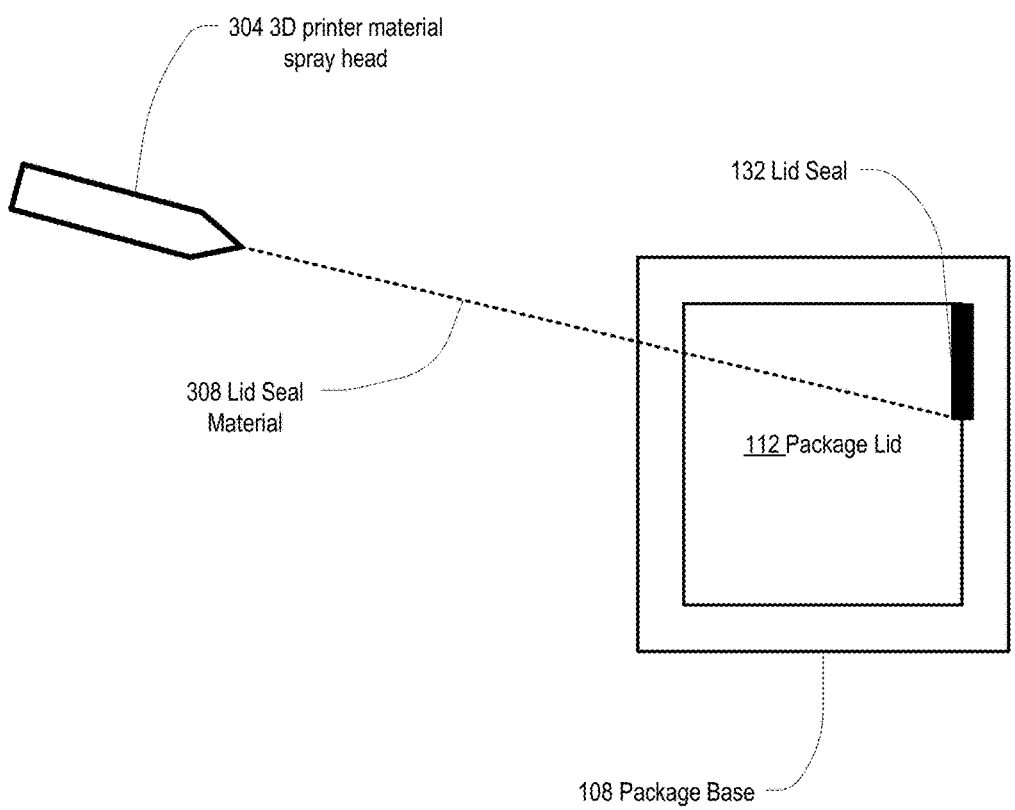

Fig. 3B  Laser Sintering Lid Seal Material
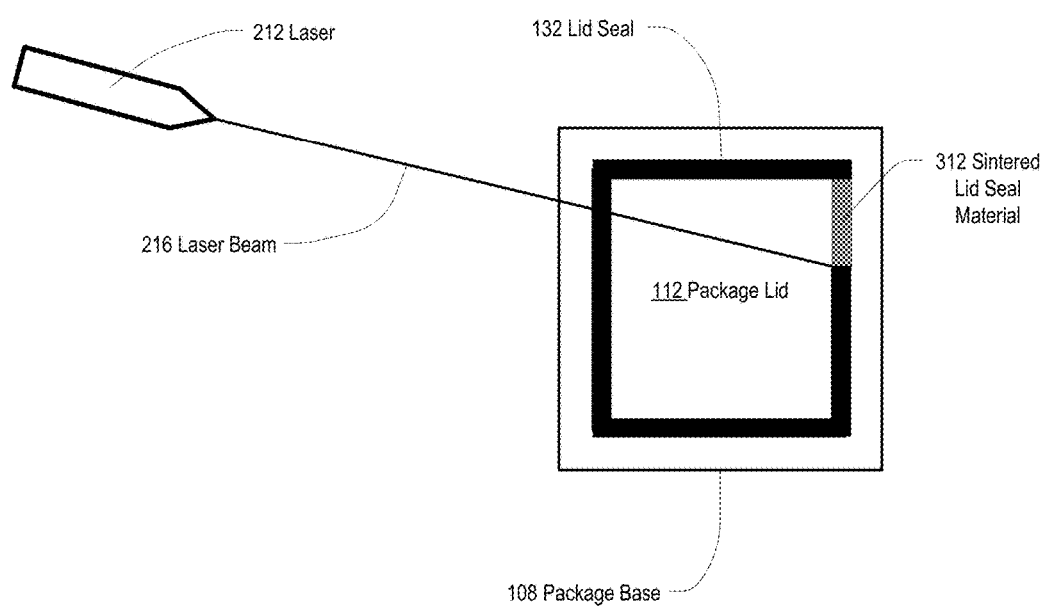

Fig. 3C  Applying Hermetic Overspray with 3D Printer
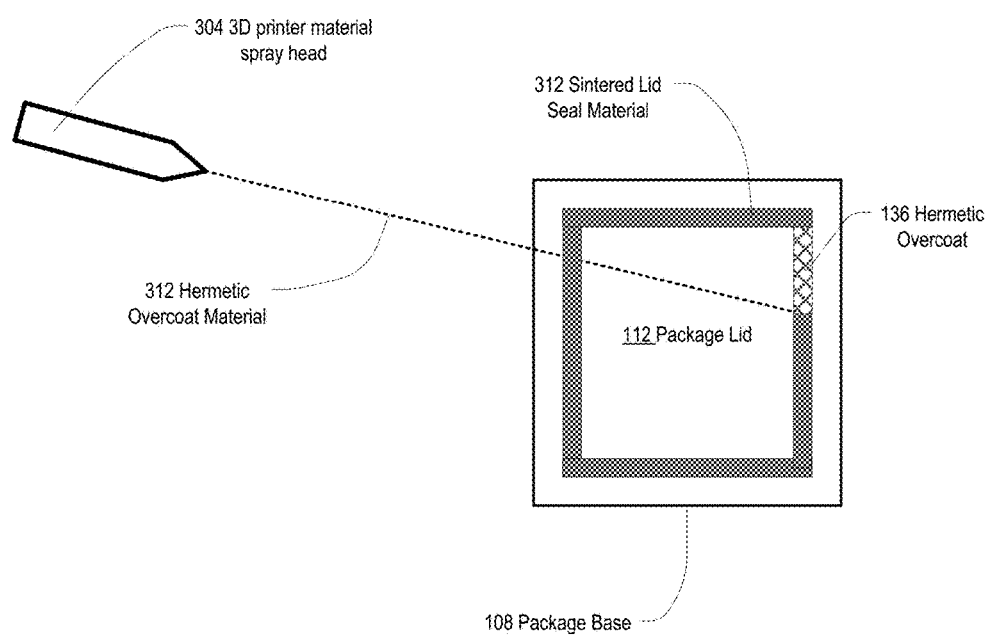

Fig. 3D Packaged Integrated Circuit with Lid Seal and Hermetic Overcoat
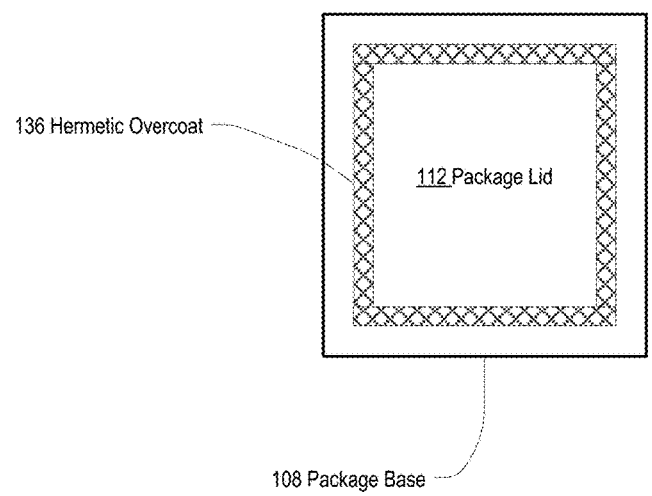

Fig. 4 Assembly Method for Hermetic Integrated Circuit
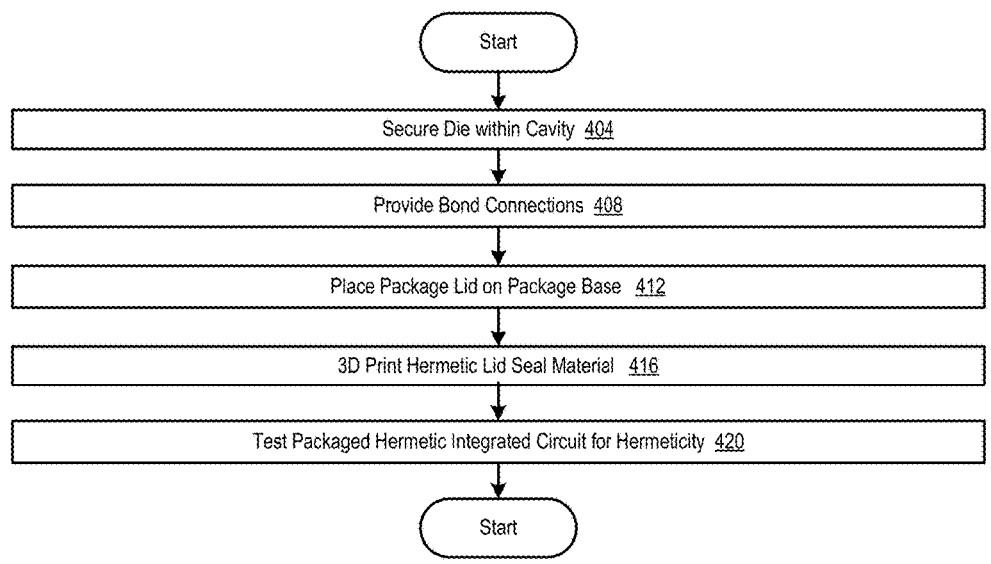

Fig. 5 Assembly Method for Hermetic Integrated Circuit
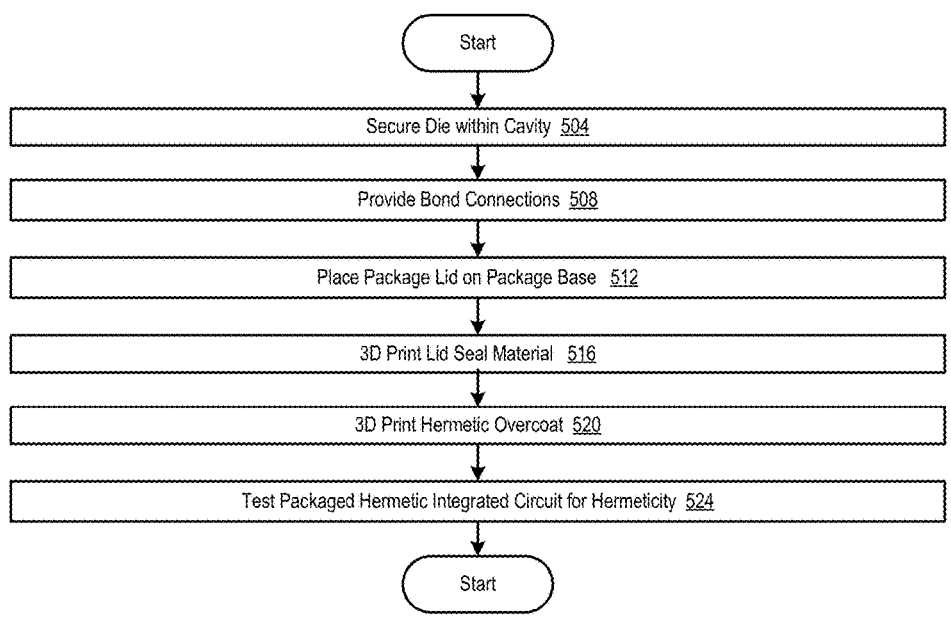

HERMETIC LID SEAL PRINTING METHOD

CROSS REFERENCE TO RELATED APPLICATION(S)

This application claims priority to earlier filed provisional application no. 62/569,717 filed Oct. 9, 2017 and entitled "HERMETIC LID SEAL METHOD AND APPARATUS", the entire contents of which are hereby incorporated by reference. This application also claims priority to earlier filed provisional application no. 62/632,249 filed Feb. 19, 2018 and entitled "HERMETIC LID SEAL METHOD AND APPARATUS", the entire contents of which are hereby incorporated by reference.

FIELD

The present invention is directed to integrated circuit packaging. In particular, the present invention is directed to methods and apparatuses for providing printed bond connections in integrated circuits.

BACKGROUND

The term "hermetic" means a seal that is gas tight or impervious to gas flow. In the context of microelectronics it implies an airtight seal that will keep moisture and other harmful gases from penetrating the sealed package. Metals, ceramics and glasses are the materials used to form hermetic packages and prevent water vapor from contaminating components inside the package. A properly made hermetic seal with a sufficiently low leak rate can keep a package dry and moisture free for many years.

Mil-STD-883 Test Method 1014 is the universally accepted test designed to determine the effectiveness or hermeticity of the seal. There are several techniques for testing hermeticity, but the most common method is to measure the rate at which helium escapes from a package that has been pressurized or backfilled with helium (the tracer gas). This measured helium leak rate is then correlated with an "air" leak rate. The hermeticity specification is based on a maximum "air" leak rate for a given package volume. The exact definition of hermeticity is defined in Test Method 1014 paragraph 3.1.1.2.1, which lists the failure criteria for a given package volume in terms of an air equivalent leak rate. When a cavity-sealed microelectronic package passes both gross and fine leak test per Test Method 1014 the part is deemed "hermetic".

Polymeric materials such as silicones and epoxies do not provide a hermetic seal and cannot be used to improve or fix a hermetic seal. Cavity packages made from polymers (e.g. LCP) or molded/potted microelectronics are known in the industry as "near-hermetic" or "non- hermetic". A "near" or "non" hermetic configuration provide enhanced resistance to moisture entry into a package, but they are not hermetic as defined by the military standards. If liquid droplets form on the surface of an IC or other active devices sensitive to moisture, then corrosion or other electrochemical reactions may occur and degrade the performance of the device and ultimately lead to failure. Moisture droplets can form as the package is cooled below the dew point. This surface water ($H_2O$) combines with any available surface ionic contamination, particularly sodium (Na) or chlorine (Cl), and along with a bias will chemically attack and corrode exposed aluminum metal at wirebond pads. The conductor metallization beneath defects, such as, cracks or pinholes in device passivation, or thin film resistor networks are also susceptible to this type of failure mechanism. Three monolayers of moisture on the surface is all that is needed to sustain surface conduction and facilitate electrochemical reactions.

Other problems caused by moisture inside a package include: electrical leakage across pins, damage to the doped layers on a silicon chip if there are pinholes in the surface passivation, arcing in a high voltage device, fogging of optical components, and "stiction" of moving parts in microelectromechanical (MEMS) components. Moisture related problems over the years have been well chronicled in technical journals and discussed at length at conferences.

SUMMARY

The present invention is directed to solving disadvantages of the prior art. In accordance with embodiments of the present invention, a method is provided. The method includes one or more of securing a die into a cavity of a hermetic package base, providing one or more bond connections to the die, placing a hermetic package lid on the package base, and 3D printing, by a 3D printer, hermetic lid seal material to a joint between the hermetic package base and the hermetic package lid, at a temperature at or below 100° C.

In accordance with another embodiment of the present invention, a method is provided. The method includes securing a die into a cavity of a hermetic package base, providing one or more bond connections to the die, placing a hermetic package lid on the hermetic package base, 3D printing, by a 3D printer, lid seal material to a joint between the hermetic package base and the hermetic package lid, at a temperature at or below 100° C., and 3D printing a hermetic overcoat over the lid seal material, the hermetic overcoat completely covering the lid seal material.

An advantage of the present invention is that it provides methods for creating a hermetic packaged integrated circuit without risking thermal degradation or destruction to a semiconductor die. Conventional lid seal processes require furnaces and other heating apparatuses that require either ambient temperatures or package heating temperatures at hundreds of degrees Celsius. This may damage thermally sensitive electro-optical, MEMS, or other devices. By utilizing 3D printing technologies for hermetic lid seal processes, the die itself is not exposed to temperatures over 100° C.

Yet another advantage of the present invention is does not require expensive furnaces or other heating apparatuses for lid seal operations. This increases production throughput for integrated circuits and saves power by not requiring high temperature heating devices.

Additional features and advantages of embodiments of the present invention will become more readily apparent from the following description, particularly when taken together with the accompanying drawings.

BRIEF DESCRIPTION OF THE DRAWINGS

FIG. 1A is a diagram illustrating a packaged integrated circuit hermetic seal configuration in accordance with a first embodiment of the present invention.

FIG. 1B is a diagram illustrating a packaged integrated circuit hermetic seal configuration in accordance with a second embodiment of the present invention.

FIG. 1C is a diagram illustrating a packaged integrated circuit hermetic seal configuration in accordance with a third embodiment of the present invention.

FIG. 1D is a diagram illustrating a packaged integrated circuit hermetic seal configuration in accordance with a fourth embodiment of the present invention.

FIG. 2A is an illustration depicting applying hermetic lid seal material with a 3D printer, in accordance with embodiments of the present invention.

FIG. 2B is an illustration depicting laser sintering hermetic lid seal material in accordance with embodiments of the present invention.

FIG. 2C is an illustration depicting a packed integrated circuit with a hermetic lid seal, in accordance with embodiments of the present invention.

FIG. 3A is an illustration depicting applying lid seal material with a 3D printer, in accordance with embodiments of the present invention.

FIG. 3B is an illustration depicting laser sintering hermetic lid seal material, in accordance with embodiments of the present invention.

FIG. 3C is an illustration depicting applying hermetic overcoat material with a 3D printer, in accordance with embodiments of the present invention.

FIG. 3D is an illustration depicting a packed integrated circuit with lid seal and hermetic overcoat, in accordance with embodiments of the present invention.

FIG. 4 is a flowchart illustrating an assembly method for a hermetic integrated circuit in accordance with a first embodiment of the present invention.

FIG. 5 is a flowchart illustrating an assembly method for a hermetic integrated circuit in accordance with a second embodiment of the present invention.

DETAILED DESCRIPTION

Some integrated circuits are required to be hermetically packaged in order to prevent external contamination, including moisture, from coming in contact with a semiconductor die. Often, optoelectronic, piezoelectronic, and MEMS devices have this type of requirement. However, sometimes these semiconductor devices are thermally sensitive and can potentially be degraded or destroyed by high temperatures encountered during packaging operations. Most frequently, high temperatures have been conventionally encountered during hermetic lid seal operations, where temperatures of well over 200° C. (300-350° Celsius or even higher is common), may be encountered. Sometimes, these are ambient temperatures within a furnace apparatus and sometimes the hermetic package itself (which thermally conducts to a die or semiconductor device within) is heated to high and potentially destructive temperatures. The present application discloses inventive processes to keep the majority of a hermetic package below 100° C. during the lid seal deposition process. In some embodiments, the majority of a hermetic package may achieve no more than 85° C. The methods of the present application disclose lid seal processes able to be conducted at room temperature.

Currently, processes such as seam seal and room temperature epoxies are used to meet packaging requirements. Seam seal may be ideal for low volume assembly, but requires package designs that add additional costs, weight, and dimensional footprint to the final product. Package designs that use epoxy seals may be useful for low cost applications. Although various epoxy materials have been proven to provide hermetic seals, they have also been tested to consistently outgas moisture into the cavity during cure. Typical epoxy sealed cavities have water vapor levels of 10,000 to 100,000 ppm (parts per million) levels, where typical MIL-STD-883 limits are a maximum of 5,000 ppm.

3D printing technologies have rapidly evolved in recent years. At first, only simple-to-work-with plastics were able to be 3D printed using additive manufacturing techniques. Most commonly, they were able to fabricate ornamental and decorative items for consumer goods. However, as material research has progressed, other more useful industrial materials have been able to be 3D printed: https://all3dp.com/l/3d-metal-3d-printer-metal-3d-printing/. Perhaps more importantly, liquid as well as solid materials may be deposited: https://www.youtube.com/watch?v=ql3pXn8-sHA and http://www.buffalo.edu/news/releases/2017/01/020.html .

Referring now to FIG. 1A, a diagram illustrating a packaged integrated circuit hermetic seal configuration 100 in accordance with a first embodiment of the present invention is shown. Die 104 is an individual semiconductor die or substrate, and is usually fabricated in suitable technologies including Silicon (Si) and Gallium Arsenide (GaAs). Die 104 may have a single die or multiple interconnected dice.

The die 104 is connected to the hermetic package base 108, package leads or downbonds (not shown), other substrates or interposers, or other circuitry within a cavity 124 of the packaged hermetic integrated circuit 100 with one or more bond connections 120. Although conventional bond wires are shown providing bond connections 120, it should be understood that any type of bond connections 120, including 3D printed bond connections, may be used in conduction with any of the disclosed lid seal processes herein.

FIG. 1A illustrates a packaged hermetic integrated circuit 100 where a hermetic package lid 112 is oriented within a recess of the hermetic package base 108, and a top surface of the hermetic package base 108 is above a top surface of the hermetic package lid 112. A hermetic lid seal 116 is applied around the periphery of the hermetic package lid 112 by a 3D printer using an additive process to completely cover the joint between the hermetic package base 108 and the hermetic package lid 112. The hermetic lid seal material 116, 208 may be any 3D-printable solid or liquid hermetic material, and includes ceramics, metals, and glasses. In one embodiment, the hermetic lid seal material 116, 208 includes zinc oxide ink or zinc oxide nanoparticle ink. In another embodiment, the hermetic lid seal material 116, 208 is 3D-printable metals in solid or liquid form including nickel, cobalt, aluminum, and steel alloys.

In the embodiment illustrated, a hermetic overcoat 136 is not required since the lid seal material 116, 208 is hermetic material. However, in other embodiments, a hermetic overcoat 136 may be required if the lid seal material 116, 208 is not hermetic material. The hermetic overcoat 136 material may be the same or different than the lid seal material 116, 208. For additional protection, both the lid seal material 132 and hermetic overspray material 136 may both be hermetic materials.

Referring now to FIG. 1B, a diagram illustrating a packaged integrated circuit hermetic seal configuration 130 in accordance with a second embodiment of the present invention is shown. Die 104 is an individual semiconductor die or substrate, and is usually fabricated in suitable technologies including Silicon (Si) and Gallium Arsenide (GaAs). Die 104 may have a single die or multiple interconnected dice.

The die 104 is connected to the hermetic package base 108, package leads or downbonds (not shown), other substrates or interposers, or other circuitry within a cavity 124 of the packaged hermetic integrated circuit 100 with one or more bond connections 120, as previously described.

FIG. 1B illustrates a packaged hermetic integrated circuit 130 where a hermetic package lid 112 is oriented flush with a recess of the hermetic package base 108, and a top surface of the hermetic package base 108 is flush with a top surface of the hermetic package lid 112. A non-hermetic lid seal 132 may be applied around the periphery of the hermetic package lid 112 by a 3D printer to completely cover the joint between the hermetic package base 108 and the hermetic package lid 112. In the embodiment illustrated, a hermetic overcoat 136 is required since the lid seal 132 material is non-hermetic material. However, in other embodiments, a hermetic overcoat 136 may not be required if the lid seal 132 material is hermetic material. For additional protection, both the lid seal material 132 and hermetic overspray material 136 may both be hermetic materials.

Referring now to FIG. 1C, a diagram illustrating a packaged integrated circuit hermetic seal configuration 140 in accordance with a third embodiment of the present invention is shown. Die 104 is an individual semiconductor die or substrate, and is usually fabricated in suitable technologies including Silicon (Si) and Gallium Arsenide (GaAs). Die 104 may have a single die or multiple interconnected dice.

The die 104 is connected to the hermetic package base 108, package leads or downbonds (not shown), other substrates or interposers, or other circuitry within a cavity 124 of the packaged hermetic integrated circuit 100 with one or more bond connections 120, as previously described.

FIG. 1C illustrates a packaged hermetic integrated circuit 140 where a hermetic package lid 112 is oriented partially above a recess of the hermetic package base 108, and a top surface of the hermetic package base 108 is below a top surface of the hermetic package lid 112. A hermetic lid seal 116 is applied around the periphery of the hermetic package lid 112 by a 3D printer to completely cover the joint between the hermetic package base 108 and the hermetic package lid 112. In the embodiment illustrated, a hermetic overcoat 136 may not required since the lid seal 116 material is hermetic material. However, in other embodiments, a hermetic overcoat 136 may be required if the lid seal 116 material is not hermetic material 132. For additional protection, both the lid seal material 132 and hermetic overspray material 136 may both be hermetic materials.

Referring now to FIG. 1D, a diagram illustrating a packaged integrated circuit hermetic seal configuration 150 in accordance with a fourth embodiment of the present invention is shown. Die 104 is an individual semiconductor die or substrate, and is usually fabricated in suitable technologies including Silicon (Si) and Gallium Arsenide (GaAs). Die 104 may have a single die or multiple interconnected dice.

The die 104 is connected to the hermetic package base 108, package leads or downbonds (not shown), other substrates or interposers, or other circuitry within a cavity 124 of the packaged hermetic integrated circuit 100 with one or more bond connections 120, as previously described.

FIG. 1D illustrates a packaged hermetic integrated circuit 150 where a hermetic package lid 112 is oriented completely above the hermetic package base 108, and a top surface of the hermetic package base 108 is flush with a bottom surface of the hermetic package lid 112. A hermetic lid seal 116 is applied around the periphery of the hermetic package lid 112 by a 3D printer to completely cover the joint between the hermetic package base 108 and the hermetic package lid 112. In the embodiment illustrated, a hermetic overcoat 136 is applied over the hermetic lid seal 116 to provide a second layer of hermetic protection to the joint between the hermetic package base 108 and the hermetic package lid 112. However, in other embodiments, a hermetic overcoat 136 may not be required if the lid seal material 132 is not hermetic material.

Referring now to FIG. 2A, an illustration depicting applying hermetic material 208 with a 3D printer, in accordance with embodiments of the present invention is shown. 3D printers are able to precisely deposit hermetic 116 or non-hermetic lid seal 132 or hermetic overcoat 136 materials on complex shapes, and are able to build up or layer the lid seal 116, 132 or overcoat 136 material to a precise thickness. FIG. 2A illustrates a lid seal configuration similar to that shown in FIG. 1D, where a hermetic package lid 112 is placed upon a top surface of a hermetic package base 108. In some embodiments, surfaces of the hermetic package lid 112 and/or hermetic package base 108 are cleaned or otherwise prepared prior to application of 3D printing processes for the low-temperature lid seal 116, 132 and/or the hermetic overcoat 136.

The 3D printer includes one or more 3D printer material spray heads 204, which apply lid seal material 116, 132 or hermetic overcoat material 136 to selected areas of the hermetic package base 108 and hermetic package lid 112. 3D printers typically deposit material in layers, and build up a desired thickness of material by depositing multiple layers. 3D printers are computer controlled equipment, and spray material according to a file or files prepared beforehand designating specific locations that material will be applied to.

In one embodiment, the 3D printer uses an extrusion process to apply either the lid seal material 116, 132 or the hermetic overcoat material 136, or both. The extrusion process, sometimes referred to as Fused Deposition Modeling (FDM) uses a heated nozzle to extrude molten material.

In another embodiment, the 3D printer uses a Colorjet Printing (CJP) process to apply either the lid seal material 116, 132 or the hermetic overcoat material 136, or both. The CJP process utilizes an inkjet-based technology to spread fine layers of a dry substrate material. The dry substrate is most often in a powder form. The inkjet applies a binder to the substrate after applying the dry substrate material in order to solidify and cure the dry substrate.

In a preferred embodiment, the 3D printer uses a selective laser sintering process. Either lid seal material 116, 132 or the hermetic overcoat material 136, or both is applied in powder form to the joint between hermetic package base 108 and the hermetic package lid 112.

In another embodiment, the 3D printer uses drop-on-demand inkjet printing and deposits liquid metal materials based on the principles of magnetohydrodynamics, i.e. the manipulation of conductive fluids using a magnetic field. In one embodiment, an electrically-pulsed magnetic field permeates liquid metal in an ejection chamber and creates circulating electrical currents that interact with the magnetic field to produce a pressure that squeezes droplets out of an ejector nozzle. A strand of aluminum is fed into a heat element that melts it at 750° C. (1,382° F.). The liquefied metal is then passed to a ceramic tube that forms an ejection chamber and has a submillimeter orifice. A magnetic coil surrounds the tube and receives a short-lived electrical pulse to create a pressure within the tube that ejects droplets of liquid metal through the orifice. The ejected drops are projected downward onto a maneuvering platform orients itself to deposit the lid seal 116, 132 or hermetic overcoat 136 materials based on layer-by-layer deposition and the coalescence of the droplets.

Any material having suitable coating and hermeticity properties, able to adhere to potentially dissimilar ceramic, glass or metal materials of the hermetic package base 108 and hermetic package lid 112, and able to be applied with a 3D printer material spray head 204 may be suitable as lid seal 116, 132 or hermetic overcoat 136.

Referring now to FIG. 2B, an illustration depicting laser sintering hermetic lid seal material in accordance with embodiments of the present invention is shown. In a laser sintering process, a laser 212 melts and cures using a laser beam 216 material applied in powder form by a 3D printer. FIG. 2A illustrates the hermetic material 208 being applied. The laser beam 216 contacts the hermetic material 208 and melts the hermetic material to form a hermetic seal 116.

Referring now to FIG. 2C, an illustration depicting a packed integrated circuit with a hermetic lid seal, in accordance with embodiments of the present invention is shown. Once the laser 212 has completely sintered the hermetic material 208 around the periphery of the hermetic lid 112, the packaged integrated circuit has a hermetic lid seal 116. In the illustrated embodiment, the lid seal material is hermetic 116, and a hermetic overcoat 136 is not required.

Referring now to FIG. 3A, an illustration depicting applying lid seal material with a 3D printer, in accordance with embodiments of the present invention is shown. 3D printers are able to precisely deposit hermetic 116 or non-hermetic 132 lid seal or overcoat 136 materials on complex shapes, and are able to build up or layer the lid seal 116, 132 or overcoat 136 material to a precise thickness. FIG. 3A illustrates a lid seal configuration similar to that shown in FIG. 1B, where a top surface of a hermetic package lid 112 is flush with a top surface of a hermetic package base 108. The applied lid seal material 308 overlaps top surfaces of both the hermetic package lid 112 and the hermetic package base 108.

The 3D printer includes one or more 3D printer material spray heads 304, which apply lid seal material 116, 132 or hermetic overcoat material 136 to selected areas of the hermetic package base 108 and hermetic package lid 112. 3D printers typically deposit material in layers, and build up a desired thickness of material by depositing multiple layers. 3D printers are computer controlled equipment, and spray material according to a file or files prepared beforehand designating specific locations that material will be applied to.

In one embodiment, the 3D printer uses an extrusion process to apply either the lid seal material 116, 132 or the hermetic overcoat material 136, or both. The extrusion process, sometimes referred to as Fused Deposition Modeling (FDM) uses a heated nozzle to extrude molten material.

In another embodiment, the 3D printer uses a Colorjet Printing (CJP) process to apply either the lid seal material 116, 132 or the hermetic overcoat material 136, or both. The CJP process utilizes an inkjet-based technology to spread fine layers of a dry substrate material. The dry substrate is most often in a powder form. The inkjet applies a binder to the substrate after applying the dry substrate material in order to solidify and cure the dry substrate.

In a preferred embodiment, the 3D printer uses a selective laser sintering process. Either lid seal material 116, 132 or the hermetic overcoat material 136, or both, are applied in powder form to the hermetic package base 108.

In another embodiment, the 3D printer uses drop-on-demand inkjet printing and deposits liquid metal materials based on the principles of magnetohydrodynamics, i.e. the manipulation of conductive fluids using a magnetic field. In one embodiment, an electrically-pulsed magnetic field permeates liquid metal in an ejection chamber and creates circulating electrical currents that interact with the magnetic field to produce a pressure that squeezes droplets out of an ejector nozzle. A strand of aluminum is fed into a heat element that melts it at 750° C. (1,382° F.). The liquefied metal is then passed to a ceramic tube that forms an ejection chamber and has a submillimeter orifice. A magnetic coil surrounds the tube and receives a short-lived electrical pulse to create a pressure within the tube that ejects droplets of liquid metal through the orifice. The ejected drops are projected downward onto a maneuvering platform orients itself to deposit the lid seal 116, 132 or hermetic overcoat 136 materials based on layer-by-layer deposition and the coalescence of the droplets.

Referring now to FIG. 3B, an illustration depicting laser sintering lid seal material in accordance with embodiments of the present invention is shown. In a laser sintering process, a laser 212 melts and cures using a laser beam 216 material applied in powder form by a 3D printer. FIG. 3A illustrates the lid seal material 308, which may be either hermetic or non-hermetic material, being applied. The laser beam 216 contacts the lid seal material 308 and melts the lid seal material 308 to produce sintered lid seal material 312.

Referring now to FIG. 3C, an illustration depicting applying hermetic overcoat material 312 with a 3D printer, in accordance with embodiments of the present invention is shown. In order to create a hermetic packaged integrated circuit, a hermetic overcoat 312 is required if the lid seal material 308 previously applied is non-hermetic. However, a hermetic overcoat 136 may also be desired if the lid seal is a hermetic lid seal 116 in order to provide additional protection. In either case, the hermetic overcoat material 312 should be applied by the 3D printer material spray head 304 in order to completely cover the sintered lid seal material 312.

Referring now to FIG. 3D, an illustration depicting a packed integrated circuit with a lid seal and hermetic overcoat, in accordance with embodiments of the present invention is shown. Once the 3D printer material spray head 304 has completely applied the hermetic overcoat 136 (and sintered the applied hermetic material 136, if necessary) around the periphery of the hermetic lid 112, the packaged integrated circuit has a hermetic lid seal. In the illustrated embodiment, the lid seal material may or may not be hermetic 116, and a hermetic overcoat 136 is required.

Any material having suitable coating and hermeticity properties, able to adhere to potentially dissimilar ceramic, glass or metal materials of the hermetic package base 108 and hermetic package lid 112, and able to be applied with a 3D printer material spray head 304 may be suitable as lid seal 116, 132 or hermetic overcoat 136.

Referring now to FIG. 4, a flowchart illustrating an assembly method for a hermetic integrated circuit 100, 130, 140, 150 in accordance with a first embodiment of the present invention is shown. Flow begins at block 404.

At block 404, a die 104 is secured within a cavity 124 of a hermetic package base 108. The hermetic package base 108 may be constructed from any of ceramic, glass, or metal hermetic materials. The die 104 may be any type of semiconductor die, including optical devices, MEMS devices, a die bonded to an interposer or substrate, or any sort of semiconductor device requiring hermetic packaging that is also sensitive to high temperatures. In some embodiments, the die 104 is secured to the hermetic package base 108 with a suitable die attach adhesive, including low-halide die attach adhesives. Flow proceeds to block 408.

At block 408, one or more bond connections 120 are provided between the die 104 and package leads or other conductive surfaces within the hermetic package base 108. The one or more bond connections 120 may include any type of bond wire or other form of electrical connections, including 3D printed bond connections. Flow proceeds to block 412.

At block 412, a hermetic package lid 112 is placed on the hermetic package base 108. The hermetic package lid 112 may be constructed from any of ceramic, glass, or metal hermetic materials. In some embodiments, the hermetic package lid 112 and hermetic package base 108 are constructed from the same material. In other embodiments, the hermetic package lid 112 and hermetic package base 108 are constructed from different materials. The hermetic package lid 112 is placed over the cavity 124 such that the hermetic package lid 112 evenly overlaps areas of the hermetic package base or substrate 108. In some embodiments (where the microelectronic component 104 is an optoelectronic component), an optically-transparent window may be present in the hermetic package lid 112. The window allows predetermined wavelengths of light to pass through the hermetic package lid 112 to the microelectronic component 104.

In some embodiments, the hermetic package lid 112 is temporarily clamped to the hermetic package base 108 during lid seal processes. Clamping the lid 112 produces a more secure packaged integrated circuit by making sure the hermetic package lid 112 is in proper and direct contact with the hermetic package base or substrate 108. The clamping force depends on details of the hermetic package lid 112, the hermetic package base 108, and the degree of fit between both. In some embodiments, a 1 lb clip should be sufficient to apply a reasonable amount of pressure. Flow proceeds to block 416.

Prior to performing lid seal steps of the inventive process, it may be necessary to prepare the package surface(s). In one embodiment, if the hermetic package lid 112 includes a window or other transparent area required for optoelectronic devices, it may be advisable to temporarily place a sticker similar to KAPTON film over the transparent window in order to prevent bonding or sealing materials from contaminating the window and thereby reducing component functionality. In another embodiment, it may be necessary to remove any contaminants from surfaces of the hermetic package lid 112, base 108, or substrate that may be in proximity to bonding or sealing areas. Contaminants may be removed by any known material, process, or technique, including wiping the contact areas with Acetone. Removing surface contaminants may include plasma cleaning the surface in a plasma oven or similar apparatus.

At block 416, a 3D printer prints hermetic lid seal material 116 on the joint between the hermetic package lid 112 and the hermetic package base 108. In one embodiment, the 3D printer applies the hermetic lid seal material to a width between 0.5-2.0 mm and a thickness of approximately 0.5 mm. The hermetic lid seal material 116 provides a moisture barrier and mechanical reliability, as well as hermetic integrity, between the cavity 124 of the packaged hermetic integrated circuit 100, 130, 140, 150 and the external environment to the packaged hermetic integrated circuit 100, 130, 140, 150. Following curing of any bonding or sealing materials 208, 308, pressure may be removed from the hermetic package lid 112 and the packaged integrated circuit may be removed from any 3D printing or packaging fixture.

The actual bonding or lid seal operation may occur at room temperature and/or atmospheric pressure, eliminating the need for vacuum or vacuum baking apparatuses for manufacture. The bonding and sealing operations may be also be performed at temperatures below 100° C., and above freezing temperatures (0° C.). A typical temperature of 30-40° C. (86-104° F.) may be commonly used for 3D printing operations, although room temperature is also sufficient. In one embodiment, the lid seal steps are performed in either a vacuum or a controlled atmosphere (i.e. in an inert gas environment). In another embodiment, the lid seal steps are performed in a noble gas environment.

In some embodiments, a thinner material layer 208, 308 is 3D printed at the joint where the hermetic base/substrate 108 and hermetic package lid 112 meet. Thickness of the lid seal layer 116, 132 is preferably below about 50 microns. The hermetic overcoat layer 136, when desired is 3D printed over the lid seal layer 116, 132 in order to completely cover the lid seal layer 116, 132. In one embodiment, the lid seal layer 116, 132 material is the same as the hermetic overcoat layer 136 material. In another embodiment, the lid seal layer 116, 132 material is different than the hermetic overcoat layer 136 material. This may be helpful for high pressure or temperature (over 100° C.) environments. Also, a cavity pressure of $10^{-9}$ atmospheres may be helpful when used in high pressure environments. In one embodiment, the lid seal layer 116, 132 includes a Copper-Nickel alloy. Flow proceeds to block 420.

At block 420, the packaged hermetic integrated circuit is tested for hermeticity. In one embodiment, the packaged hermetic integrated circuit 100, 130, 140, 150 is tested for hermeticity per MIL-SPEC-883. Other forms of testing may be performed and include any and all forms of functional testing and electrical testing. Flow ends at block 420.

Referring now to FIG. 5, a flowchart illustrating an assembly method for a hermetic integrated circuit 100, 130, 140, 150 in accordance with a second embodiment of the present invention is shown. FIG. 4 provides a separate 3D printing step for providing a hermetic overcoat 136, but otherwise includes the same considerations and options as previously described in the embodiment of FIG. 4. Flow begins at block 504.

At block 504, a die 104 is secured within a cavity 124 of a hermetic package base 108. The hermetic package base 108 may be constructed from any of ceramic, glass, or metal hermetic materials. The die 104 may be any type of semiconductor die, including optical devices, MEMS devices, a die bonded to an interposer or substrate, or any sort of semiconductor device requiring hermetic packaging that is also sensitive to high temperatures. In some embodiments, the die 104 is secured to the hermetic package base 108 with a suitable die attach adhesive, including low-halide die attach adhesives. Flow proceeds to block 508.

At block 508, one or more bond connections 120 are provided between the die 104 and package leads or other conductive surfaces within the hermetic package base 108. The one or more bond connections 120 may include any type of bond wire or other form of electrical connections, including 3D printed bond connections. Flow proceeds to block 512.

At block 512, a hermetic package lid 112 is placed on the hermetic package base 108. The hermetic package lid 112 may be constructed from any of ceramic, glass, or metal hermetic materials. In some embodiments, the hermetic package lid 112 and hermetic package base 108 are constructed from the same material. In other embodiments, the hermetic package lid 112 and hermetic package base 108 are constructed from different materials. In some embodiments, the hermetic package lid 112 is temporarily clamped to the hermetic package base 108 during lid seal processes. The clamping force depends on details of the hermetic package lid 112, the hermetic package base 108, and the degree of fit between both. Flow proceeds to block 516.

At block 516, a 3D printer prints hermetic lid seal material 132 on the joint between the hermetic package lid 112 and the hermetic package base 108. In one embodiment, the 3D printer applies the lid seal material 208, 308 to a width between 0.5-2.0 mm and a thickness of approximately 0.5 mm. The lid seal material 132 provides a moisture barrier and mechanical reliability, as well as hermetic integrity (when hermetic lid seal material 208 is used), between the cavity 124 of the packaged hermetic integrated circuit 100, 130, 140, 150 and the external environment to the packaged hermetic integrated circuit 100, 130, 140, 150. Flow proceeds to block 520.

At block 520, a 3D printer 3D prints a hermetic overcoat 136 over the lid seal material 132. In one embodiment, the hermetic overcoat 136 is non-hermetic material when the lid seal 116 uses hermetic material 208. In most embodiments, the hermetic overcoat 136 is hermetic material. The hermetic overcoat 136 completely covers the lid seal material 116, 132 and protects the exposed material. In one embodiment, the thickness of the applied hermetic overcoat 136 is thinner than the thickness of the lid seal material 116, 132. In another embodiment, the thickness of the hermetic overcoat 136 material depends on whether the lid seal material is hermetic 116 or non-hermetic 132. In another embodiment, the thickness of the hermetic overcoat 136 material is thinner whether the lid seal material is hermetic 116 and thicker when the lid seal material is non-hermetic 132. Flow proceeds to block 524.

At block 524, the packaged hermetic integrated circuit is tested for hermeticity. In one embodiment, the packaged hermetic integrated circuit 100, 130, 140, 150 is tested for hermeticity per MIL-SPEC-883. Other forms of testing may be performed and include any and all forms of functional testing and electrical testing. Flow ends at block 524.

Finally, those skilled in the art should appreciate that they can readily use the disclosed conception and specific embodiments as a basis for designing or modifying other structures for carrying out the same purposes of the present invention without departing from the spirit and scope of the invention as defined by the appended claims.

The invention claimed is:

1. A method, comprising:
securing a die into a cavity of a hermetic package base;
providing one or more bond connections to the die;
placing a hermetic package lid on the package base;
3D printing, by a 3D printer, hermetic lid seal material to a joint between the hermetic package base and the hermetic package lid, at a temperature at or below 100 degrees Celsius; and
3D printing, by the 3D printer, a hermetic overcoat over the hermetic lid seal material in order to completely cover the hermetic lid seal material, a thickness of the hermetic overcoat less than a thickness of the hermetic lid seal material.

2. The method as recited in claim 1, further comprising:
clamping the hermetic package lid to the hermetic package base prior to 3D printing hermetic lid seal material.

3. The method as recited in claim 1, wherein the die comprises a device that may be damaged at temperatures over 300 degrees Celsius, wherein the hermetic lid seal material is a hermetic compound.

4. The method as recited in claim 3, wherein the hermetic package base comprises one of ceramic, metal, or glass, wherein the hermetic package lid comprises one of ceramic, metal, or glass.

5. The method as recited in claim 4, wherein the hermetic package base material is different than the hermetic package lid material.

6. The method as recited in claim 3, wherein the hermetic lid seal material comprises zinc oxide.

7. The method as recited in claim 3, wherein the lid seal material is 3D printed in liquid form.

8. The method as recited in claim 3, wherein the 3D printer applies the hermetic lid seal material by a selective laser sintering process, the selective laser sintering process comprising:
3D printing, by a 3D printer, the lid seal material in powder form to a joint between the hermetic package lid and the hermetic package base; and
melting the lid seal material, by a laser, to form a hermetic bond between the hermetic package lid and the hermetic package base.

9. The method as recited in claim 3, further comprising:
maintaining a die temperature of less than 100 degrees Celsius while 3D printing one or more of the lid seal material or the hermetic overcoat.

10. The method as recited in claim 3, further comprising:
3D printing the lid seal material within an inert gas environment.

11. A method, comprising:
securing a die into a cavity of a hermetic package base;
providing one or more bond connections to the die;
placing a hermetic package lid on the hermetic package base;
3D printing, by a 3D printer, lid seal material to a joint between the hermetic package base and the hermetic package lid, at a temperature at or below 100 degrees Celsius; and
3D printing a hermetic overcoat over the lid seal material, the hermetic overcoat completely covering the lid seal material, a thickness of the hermetic overcoat depending on whether the lid seal material is hermetic.

12. The method as recited in claim 11, further comprising:
clamping the hermetic package lid to the hermetic package base prior to 3D printing lid seal material.

13. The method as recited in claim 11, wherein the die comprises a device that may be damaged at temperatures over 300 degrees Celsius, wherein the hermetic overcoat material is a hermetic compound.

14. The method as recited in claim 13, wherein the hermetic package base comprises one of ceramic, metal, or glass, wherein the hermetic package lid comprises one of ceramic, metal, or glass.

15. The method as recited in claim 14, wherein the hermetic package base material is different than the hermetic package lid material.

16. The method as recited in claim 13, wherein the hermetic lid seal material comprises zinc oxide.

17. The method as recited in claim 13, wherein at least the lid seal material is 3D printed in liquid form.

18. The method as recited in claim 13, wherein the 3D printer applies one or more of the lid seal material and the hermetic overcoat by a selective laser sintering process, the selective laser sintering process comprising:
3D printing, by a 3D printer, one or more of the lid seal material and hermetic overcoat material in powder form to a joint between the hermetic package lid and the hermetic package base; and
melting, by a laser, one or more of the lid seal material and hermetic overcoat material to form a hermetic bond between the hermetic package lid and the hermetic package base.

19. The method as recited in claim 13, further comprising:
maintaining a die temperature of less than 100 degrees Celsius while 3D printing the lid seal material and the hermetic overcoat.
20. The method as recited in claim 13, further comprising:
3D printing the lid seal material within a noble gas environment; and
3D printing the hermetic overcoat within a noble gas environment, in response to 3D printing a non-hermetic lid seal material.

* * * * *